(12) United States Patent
Yosui

(10) Patent No.: US 11,470,728 B2
(45) Date of Patent: Oct. 11, 2022

(54) MULTILAYER BOARD AND CONNECTING STRUCTURE OF THE SAME

(71) Applicant: Murata Manufacturing Co., Ltd., Nagaokakyo (JP)

(72) Inventor: Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/063,739

(22) Filed: Oct. 6, 2020

(65) Prior Publication Data

US 2021/0022255 A1    Jan. 21, 2021

Related U.S. Application Data

(63) Continuation of application No. PCT/JP2019/017693, filed on Apr. 25, 2019.

(30) Foreign Application Priority Data

May 7, 2018   (JP) ............................. JP2018-089277

(51) Int. Cl.
*H05K 1/02* (2006.01)
*H05K 3/46* (2006.01)
(Continued)

(52) U.S. Cl.
CPC ........... *H05K 3/4691* (2013.01); *H05K 1/028* (2013.01); *H05K 1/0298* (2013.01); *H05K 1/147* (2013.01);
(Continued)

(58) Field of Classification Search
CPC .............. H05K 3/4691; H05K 1/0298; H05K 2201/0129; H05K 2201/0379;
(Continued)

(56) References Cited

U.S. PATENT DOCUMENTS 4,716,259 A * 12/1987 Tokura .................. H05K 1/028
174/254
4,885,430 A * 12/1989 Kinser, Jr. .............. H05K 1/028
439/31
(Continued)

FOREIGN PATENT DOCUMENTS

JP      62-204370 U    12/1987
JP      05-95074 U     12/1993
(Continued)

OTHER PUBLICATIONS

English Translation JP2012147550 (Year: 2012).*
Official Communication issued in International Patent Application No. PCT/JP2019/017693 dated Jun. 25, 2019.

*Primary Examiner* — Steven T Sawyer
(74) *Attorney, Agent, or Firm* — Keating & Bennett, LLP

(57) ABSTRACT

A multilayer board includes a flexible substrate including insulating layers stacked and a pair of through-holes penetrating the insulating layers, and an interlayer connecting conductor in an opposing region in which the pair of through-holes opposes each other in a plan view of the insulating layers viewed from a stacking direction. A cross section of the flexible substrate taken in a lateral direction passing through the pair of through-holes and the interlayer connecting conductor and the stacking direction has a U or S shape. In the cross section, a curvature radius of an inner region located between the pair of through-holes is larger than a curvature radius of an outer region adjacent to the pair of through-holes on an outer side thereof.

21 Claims, 14 Drawing Sheets

(51) Int. Cl.
*H05K 1/18* (2006.01)
*H05K 1/14* (2006.01)

(52) U.S. Cl.
CPC ............ *H05K 1/189* (2013.01); *H05K 1/0283* (2013.01); *H05K 2201/0129* (2013.01); *H05K 2201/0379* (2013.01); *H05K 2201/096* (2013.01)

(58) Field of Classification Search
CPC .............. H05K 2201/096; H05K 1/116; H05K 2201/0133; H05K 2201/0187; H05K 2201/09063; H05K 1/028; H05K 1/0283; H05K 1/0326; H05K 1/0333; H05K 1/0346; H05K 1/0278; H05K 2201/0141; H05K 2201/0154; H05K 2201/055; H05K 2201/09263; H05K 2201/097; H05K 2201/09727; H05K 1/118; H05K 1/147; H05K 1/148; H05K 1/189; H05K 2201/05; H05K 2201/058; H05K 2201/2009
See application file for complete search history.

(56) References Cited

U.S. PATENT DOCUMENTS

| | | | |
|---|---|---|---|
| 5,445,869 A * | 8/1995 | Ishikawa | H05K 1/028 428/209 |
| 9,402,303 B2 * | 7/2016 | Qian | H05K 1/0221 |
| 2008/0088768 A1 * | 4/2008 | Kohno | G02F 1/13452 349/60 |
| 2013/0087375 A1 | 4/2013 | Tsunoi | |
| 2014/0184359 A1 | 7/2014 | Iida et al. | |
| 2014/0354900 A1 * | 12/2014 | Qian | H05K 1/028 174/254 |
| 2015/0065840 A1 * | 3/2015 | Bailey | A61B 5/296 600/384 |
| 2015/0195900 A1 | 7/2015 | Wakabayashi et al. | |
| 2015/0282295 A1 * | 10/2015 | Matsumoto | H05K 3/14 361/749 |
| 2016/0150636 A1 * | 5/2016 | Otsubo | H05K 1/028 174/254 |
| 2016/0270234 A1 * | 9/2016 | Ahn | G06F 3/047 |
| 2016/0327223 A1 * | 11/2016 | Venk | H05K 1/189 |
| 2019/0037685 A1 | 1/2019 | Oguri et al. | |

FOREIGN PATENT DOCUMENTS

| | | |
|---|---|---|
| JP | 2000-082868 A | 3/2000 |
| JP | 2005-235997 A | 9/2005 |
| JP | 2008-198938 A | 8/2008 |
| JP | 2009-158571 A | 7/2009 |
| JP | 2013-084729 A | 5/2013 |
| WO | 2012/147550 A1 | 11/2012 |
| WO | 2013/114975 A1 | 8/2013 |
| WO | 2015/015959 A1 | 2/2015 |
| WO | 2018/128045 A1 | 7/2018 |

* cited by examiner

MULTILAYER BOARD AND CONNECTING STRUCTURE OF THE SAME

CROSS REFERENCE TO RELATED APPLICATIONS

This application claims the benefit of priority to Japanese Patent Application No. 2018-089277 filed on May 7, 2018 and is a Continuation Application of PCT Application No. PCT/JP2019/017693 filed on Apr. 25, 2019. The entire contents of each application are hereby incorporated herein by reference.

BACKGROUND OF THE INVENTION

1. Field of the Invention

The present invention relates to a multilayer board including a plurality of stacked insulating layers and a connecting structure thereof.

2. Description of the Related Art

Conventionally, there is a multilayer board of this type that is flexible and can be curved. When the multilayer board is provided with an interlayer connecting conductor having no flexibility, bending stress may cause cracking, peeling or the like in the interlayer connecting conductor and its periphery. In this case, the connection reliability of the interlayer connecting conductor is lowered.

In contrast, International Patent Publication No. WO 2013/114975 A1 describes a multilayer board in which a plurality of interlayer connecting conductors penetrating at least one insulating layer are arranged by shifting them in the surface direction in a plan view from the stacking direction of a plurality of insulating layers. According to the multilayer board of International Patent Publication No. WO 2013/114975 A1, as compared with the multilayer board in which a plurality of interlayer connecting conductors are arranged without shifting in the surface direction, it is possible to suppress bending stress from being concentrated, and to suppress cracking, peeling or the like from occurring in the interlayer connecting conductor and its periphery.

However, a space for shifting a plurality of interlayer connecting conductors in the surface direction is required in the configuration of International Patent Publication No. WO 2013/114975 A1. Therefore, it may be difficult to apply this configuration to a small multilayer board.

SUMMARY OF THE INVENTION

Preferred embodiments of the present invention provide multilayer boards each of which relaxes or reduces the bending stress applied to the interlayer connecting conductor in a significantly reduced space, and are able to significantly reduce or prevent a decrease in the connection reliability of the interlayer connecting conductor.

A multilayer board according to a preferred embodiment of the present invention includes a flexible substrate that includes a plurality of insulating layers stacked and is provided with a pair of through-holes penetrating the plurality of insulating layers and an interlayer connecting conductor provided in an opposing region in which the pair of through-holes opposes each other in a plan view of the plurality of insulating layers viewed from a stacking direction. A cross section of the flexible substrate taken in a lateral direction passing through the pair of through-holes and the interlayer connecting conductor and the stacking direction is curved in a U shape or an S shape. In the cross section, a curvature radius of an inner region located between the pair of through-holes is larger than a curvature radius of an outer region adjacent to the pair of through-holes on an outer side thereof.

A connecting structure of a multilayer board according to a preferred embodiment of the present invention includes a flexible substrate that includes a plurality of insulating layers stacked and is provided with a pair of through-holes penetrating the plurality of insulating layers and an interlayer connecting conductor provided in an opposing region in which the pair of through-holes opposes each other in a plan view of the plurality of insulating layers viewed from a stacking direction. The flexible substrate is attached to an object to be connected, and a cross section of the flexible substrate taken in a lateral direction passing through the pair of through-holes and the interlayer connecting conductor and the stacking direction is curved in a U shape or an S shape. In the cross section, a curvature radius of an inner region located between the pair of through-holes is larger than a curvature radius of an outer region adjacent to the pair of through-holes on an outer side thereof.

According to preferred embodiments of the present invention, relaxation of the bending stress applied to the interlayer connecting conductor is able to be provided in a significantly reduced space, and a decrease in the connection reliability of the interlayer connecting conductor is able to be significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
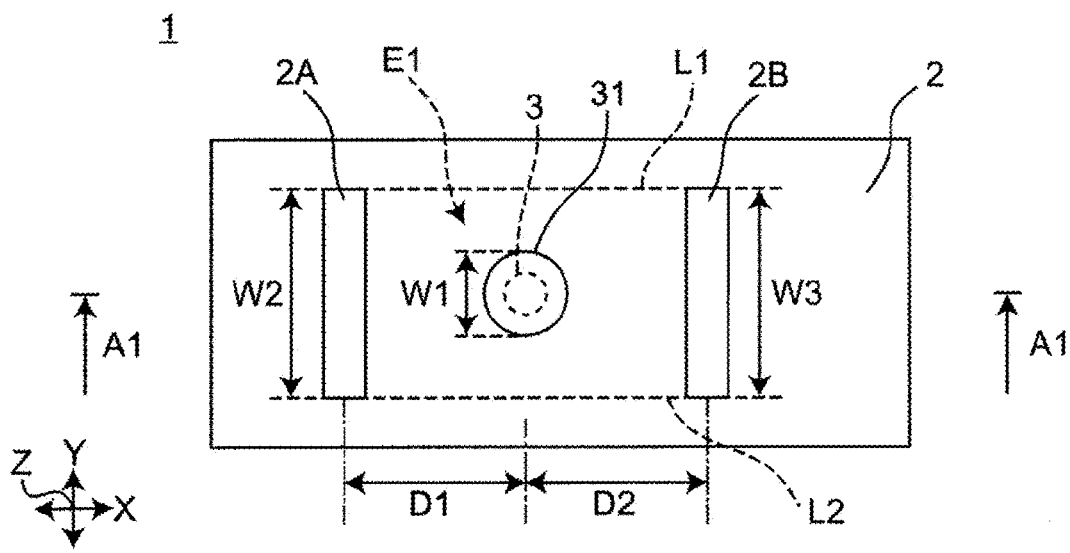
FIG. 1A is a plan view showing a multilayer board according to a first preferred embodiment of the present invention.

A multilayer board according to a preferred embodiment of the present invention includes a flexible substrate that includes a plurality of insulating layers stacked and is provided with a pair of through-holes penetrating the plurality of insulating layers and an interlayer connecting conductor provided in an opposing region in which the pair of through-holes opposes each other in a plan view of the plurality of insulating layers viewed from a stacking direction. A cross section of the flexible substrate taken in a lateral direction passing through the pair of through-holes and the interlayer connecting conductor and the stacking direction is curved in a U shape or an S shape. In the cross section, a curvature radius of an inner region located between the pair of through-holes is larger than a curvature radius of an outer region adjacent to the pair of through-holes on an outer side.

According to the structure described above, by providing a pair of through-holes that penetrate the plurality of insulating layers, the outer region is able to be easily bent as compared with the inner region located between the pair of through-holes. By providing the interlayer connecting conductor in the opposing region where the pair of through-holes opposes each other, relaxation of the bending stress applied to the interlayer connecting conductor is able to be provided in a significantly reduced space as compared with International Patent Publication No. WO 2013/114975 A1. In addition, since the bending stress applied to the interlayer connecting conductor is able to be relaxed, a decrease in the connection reliability of the interlayer connecting conductor is able to be significantly reduced or prevented.

Note that the interlayer connecting conductor may be provided in the middle portion of the opposing region.

According to the structure described above, the bending stress applied to the interlayer connecting conductor is able to be further relaxed, and a decrease of the connection reliability of the interlayer connecting conductor is able to be further significantly reduced or prevented.

In addition, at least one of the pair of through-holes may be defined by slits having a longitudinal direction in a direction intersecting the lateral direction in the plan view. Accordingly, since the area of the opposing region where the pair of through-holes opposes each other is able to be increased, the bending stress applied to the interlayer connecting conductor is able to be further relaxed, and the connection reliability of the interlayer connecting conductor is able to be further significantly reduced or prevented from being lowered.

In addition, at least one of the pair of through-holes may be defined by slits having a longitudinal direction in a direction orthogonal or substantially orthogonal to the lateral direction in the plan view. Accordingly, since the area of the opposing region where the pair of through-holes opposes each other is able to be further increased, the bending stress applied to the interlayer connecting conductor is able to be further relaxed, and the connection reliability of the interlayer connecting conductor is able to be further significantly reduced or prevented from being lowered.

In addition, at least one of the pair of through-holes may be divided into a plurality of holes and located at intervals in a direction intersecting the lateral direction in the plan view. Accordingly, a decrease in mechanical strength due to the through-holes is able to be significantly reduced or prevented while ensuring flexibility.

In addition, the flexible substrate is further provided with another pair of through-holes different from the pair of through-holes that penetrate the plurality of the insulating layers, and the other pair of through-holes may oppose each other with the interlayer connecting conductor provided therebetween in the lateral direction in the plan view. Accordingly, the outer region is able to be bent more easily than the inner region located between the pair of through-holes, and the bending stress applied to the interlayer connecting conductor is able to be further relaxed. As a result, a decrease in the connection reliability of the interlayer connecting conductor is able to be further significantly reduced or prevented.

In addition, the flexible substrate is further provided with another pair of through-holes different from the pair of through-holes that penetrate the plurality of insulating layers, and the other pair of through-holes oppose each other with the interlayer connecting conductor provided therebetween in a direction intersecting the lateral direction in the plan view. Accordingly, even if the flexible substrate is bent in the direction intersecting the lateral direction, the bending stress applied to the interlayer connecting conductor is able to be relaxed. As a result, a decrease in the connection reliability of the interlayer connecting conductor is able to be further significantly reduced or prevented.

In addition, the interlayer connecting conductor may include a through-hole via that penetrates the plurality of insulating layers. Since the length of the through-hole via is usually long in the longitudinal direction, cracking, peeling or the like is likely to occur due to the bending stress. On the other hand, according to the structure of the multilayer board according to a preferred embodiment of the present invention, since the pair of through-holes is provided at the positions opposing each other with the through-hole via provided therebetween, the bending stress applied to the through-hole via is able to be relaxed across all the layers of the plurality of insulating layers. As a result, a decrease in the connection reliability of the interlayer connecting conductor is able to be further significantly reduced or prevented.

In addition, the interlayer connecting conductor may include a hollow via. Since the hollow via has a thin wall thickness, cracking, peeling or the like is more likely to occur than the filled via. On the other hand, according to the structure of the multilayer board according to a preferred embodiment of the present invention, since the pair of through-holes is provided at positions opposing each other with the hollow via provided therebetween, the bending stress applied to the interlayer connecting conductor is able to be relaxed to significantly reduce or prevent the occurrence of cracking, peeling or the like. As a result, a decrease in the connection reliability of the interlayer connecting conductor is able to be further significantly reduced or prevented.

In addition, the interlayer connecting conductor may include a plurality of via conductors that penetrate the different insulating layers, respectively, and offset in a width direction orthogonal or substantially orthogonal to the lateral direction in the plan view; and a connecting conductor that connects the plurality of via conductors. Accordingly, since the plurality of via conductors are offset in the width direction, the bending stress applied to the interlayer connecting conductor is able to be dispersed.

In addition, for example, even when the flexible substrate is bent and twisted, the bending stress applied to the interlayer connecting conductor is able to be relaxed. As a result, a decrease in the connection reliability of the interlayer connecting conductor is able to be further significantly reduced or prevented.

In addition, an elastic body having an elastic modulus lower than an elastic modulus of the insulating layer may be located in at least one of the pair of through-holes. Accordingly, the portion around the through-hole is able to be significantly reduced or prevented from being damaged when bending stress is applied.

A connecting structure of a multilayer board according to a preferred embodiment of the present invention includes a flexible substrate that includes a plurality of insulating layers stacked and is provided with a pair of through-holes penetrating the plurality of insulating layers and an interlayer connecting conductor provided in an opposing region in which the pair of through-holes opposes each other in a plan view of the plurality of insulating layers viewed from a stacking direction. The flexible substrate is attached to an object to be connected and a cross section of the flexible substrate taken in a lateral direction passing through the pair of through-holes and the interlayer connecting conductor and the stacking direction is curved in a U shape or an S shape. In the cross section, a curvature radius of an inner region located between the pair of through-holes is larger than a curvature radius of an outer region adjacent to the pair of through-holes on an outer side thereof.

According to the structure described above, by providing a pair of through-holes that penetrate the plurality of insulating layers, the outer region is able to be easily bent as compared with the inner region located between the pair of through-holes. By providing the interlayer connecting conductor in the opposing region where the pair of through-holes opposes each other, relaxation of the bending stress applied to the interlayer connecting conductor is able to be provided in a significantly reduced space as compared with International Patent Publication No. WO 2013/114975 A1. In addition, since the bending stress applied to the interlayer connecting conductor is able to be relaxed, a decrease in the connection reliability of the interlayer connecting conductor is able to be significantly reduced or prevented.

Hereinafter, various preferred embodiments for carrying out the present invention will be described with reference to the drawings. In each drawing, corresponding bodies having the same or similar function are designated by the same reference numerals. Although the preferred embodiments are shown separately for convenience in consideration of the explanation of the main points or the ease of understanding, partial replacement or combination of the features, components, and/or elements shown in the different preferred embodiments is possible. In the second and subsequent preferred embodiments, the description of matters common to those of the first preferred embodiment will be omitted, and only the differences will be described. In particular, similar working effects due to the same or similar features, components, and/or elements will not be mentioned sequentially for each preferred embodiment.

Figure 1B:
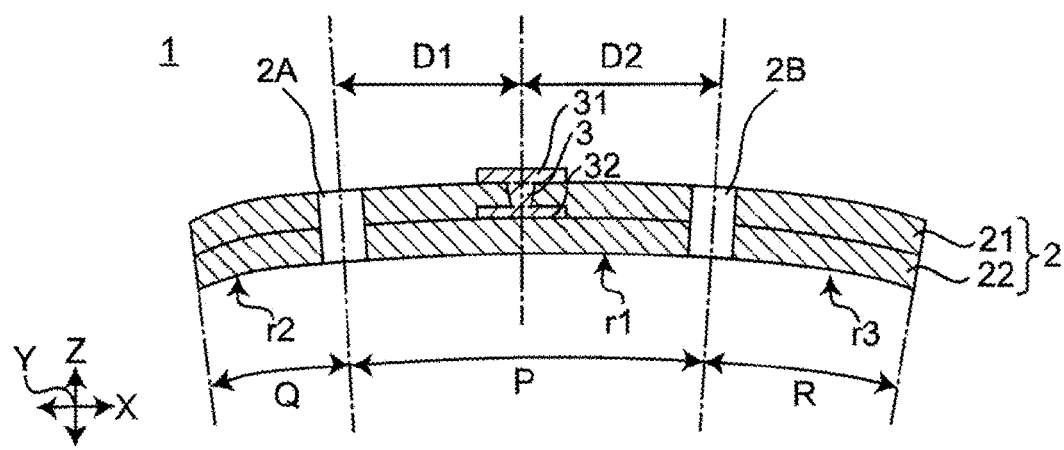
FIG. 1B is a sectional view taken along line A1-A1 in FIG. 1A.

FIG. 1A is a plan illustrating a multilayer board according to a first preferred embodiment of the present invention. FIG. 1B is a sectional view taken along line A1-A1 of FIG. 1A.

As shown in FIGS. 1A and 1B, a multilayer board 1 according to the present first preferred embodiment includes a flexible substrate 2 and an interlayer connecting conductor 3.

The flexible substrate 2 includes a plurality of stacked insulating layers 21 and 22. The thickness of the insulating layers 21 and 22 is, for example, about 30 μm or more and about 80 μm or less. A pair of through-holes 2A and 2B is provided in the plurality of insulating layers 21 and 22 and penetrate the insulating layers 21 and 22.

In the present first preferred embodiment, the thickness direction of the multilayer board 1 passing through the interlayer connecting conductor 3 is referred to as the stacking direction of the plurality of insulating layers 21 and 22 or the Z direction. In addition, as shown in FIG. 1A, the longitudinal direction of the flexible substrate 2 passing through the pair of through-holes 2A and 2B and the interlayer connecting conductor 3 in the plan view seen from the Z direction is referred to as the lateral direction or the X direction, and the short direction orthogonal or substantially orthogonal to the longitudinal direction of the flexible substrate 2 is referred to as the width direction or the Y direction.

In the present first preferred embodiment, the pair of through-holes 2A and 2B is defined by slits having a longitudinal direction in the Y direction. The shape of the slit in a plan view is, for example, a rectangle, substantially a rectangle, an ellipse, or substantially an ellipse. In the present first preferred embodiment, the shape of the slit in a plan view is a rectangle. In addition, the longitudinal directions of the pair of through-holes 2A and 2B are parallel or substantially parallel to each other.

The interlayer connecting conductor 3 is provided in an opposing region E1 in which a pair of through-holes 2A and 2B opposes each other in a plan view. Here, the "opposing region E1" is a region surrounded by the virtual straight lines L1 and L2 and the pair of through-holes 2A and 2B, as shown in FIG. 1A. The virtual straight line L1 is a virtual straight line connecting one end portion of the through-hole 2A in the Y direction and one end portion of the through-hole 2B in the Y direction. The virtual straight line L2 is a virtual straight line connecting the other end portion of the through-hole 2A in the Y direction and the other end portion of the through-hole 2B in the Y direction.

In the present first preferred embodiment, the interlayer connecting conductor 3 is provided in the intermediate portion of the opposing region E1. In other words, the pair of through-holes 2A and 2B is provided at symmetrical or substantially symmetrical positions with respect to the interlayer connecting conductor 3. That is, in the X direction, the interlayer connecting conductor 3 is provided at a position where the distance D1 from the center of the interlayer connecting conductor 3 to the center of the through-hole 2A and the distance D2 from the center of the interlayer connecting conductor 3 to the center of the through-hole 2B are equal or substantially equal.

The interlayer connecting conductor 3 is a via conductor that electrically connects a surface conductor 31 provided on the upper surface side of the insulating layer 21 and a surface conductor 32 provided on the lower surface side of the insulating layer 21. In a plan view, the outer shapes of the surface conductors 31 and 32 and the interlayer connecting conductor 3 are provided in a shape of, for example, a circle, a square, a rectangle, an ellipse, or substantially any one of these shapes. In the present first preferred embodiment, the outer shapes of the surface conductors 31 and 32 and the interlayer connecting conductor 3 are circular. In a plan view, the outer shapes of the surface conductors 31 and 32 are larger than the outer shape of the interlayer connecting conductor 3 and include the interlayer connecting conductor 3.

In addition, the length W1 in the short direction of the surface conductors 31 and 32 in contact with the interlayer connecting conductor 3 (here, the diameter of the surface conductors 31 and 32) is smaller than the length W2 of the through-hole 2A in the Y direction and the length W3 of the through-hole 2B in the Y direction. In the present first preferred embodiment, the length W2 of the through-hole 2A in the Y direction and the length W3 of the through-hole 2B in the Y direction are the same or substantially the same length. The length W1 in the short direction of the surface conductors 31 and 32 is, for example, about 200 μm or more and about 400 μm or less. The diameter of the interlayer connecting conductor 3 is, for example, about 120 μm or more and about 240 μm or less. The length of the pair of through-holes 2A and 2B in the X direction is, for example, about 30 μm or more and about 80 μm or less.

In addition, a cross section of the flexible substrate 2 taken in the X direction and the Z direction is curved in a U shape (including a bow shape) as shown in FIG. 1B. In the cross section, the curvature radius r1 of the inner region P located between the pair of through-holes 2A and 2B is larger than the curvature radii r2 and r3 of the outer regions Q and R adjacent to the pair of through-holes 2A and 2B, respectively, on the outside thereof. In other words, the curvature radius of the inner region P is smaller than the curvature radii of the outer regions Q and R.

Note that by positioning the pair of through-holes 2A and 2B in the X direction to be closer to the interlayer connecting conductor 3 than the end portions of the flexible substrate 2 in the X direction, the outer regions Q and R are able to be widened to increase the degree of freedom of the curvature radii r2 and r3. That is, the degree of freedom of the bending shape of the multilayer board 1 is able to be increased. Note that an entirety of each of the outer regions Q and R does not need to have uniform curvature radii r2 and r3, and the portions of the outer regions Q and R adjacent to the pair of through-holes 2A and 2B on the outside thereof may have different curvature radii r2 and R3.

Next, an example of a method for manufacturing the multilayer board 1 will be described. FIGS. 2A to 2D are sectional views illustrating an example of a method for manufacturing the multilayer board 1.

First, two insulating films to be the insulating layers 21 and 22 are prepared. The insulating film is a thermoplastic resin, for example, a liquid crystal polymer (LCP). One entire surface of each insulating film is covered with copper foil.

Next, the insulating layer 21 in which a pattern including the surface conductor 31 is provided and the insulating layer 22 in which a pattern including the surface conductor 32 is provided are formed by performing a patterning treatment, for example, photolithography on each insulating film.

Figure 2A:
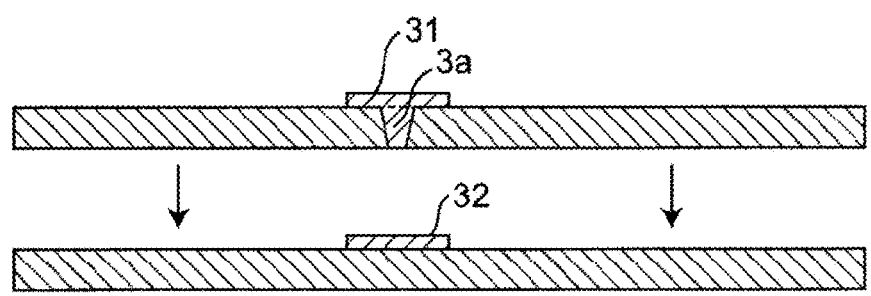
FIG. 2A is a sectional view illustrating one example of a method for manufacturing a multilayer board illustrated in FIG. 1A.

Next, via holes are formed in the insulating layer 21 by laser processing or the like, and the via holes are filled with a conductive paste 3a to be the interlayer connecting conductor 3 as shown in FIG. 2A.

Figure 2B:
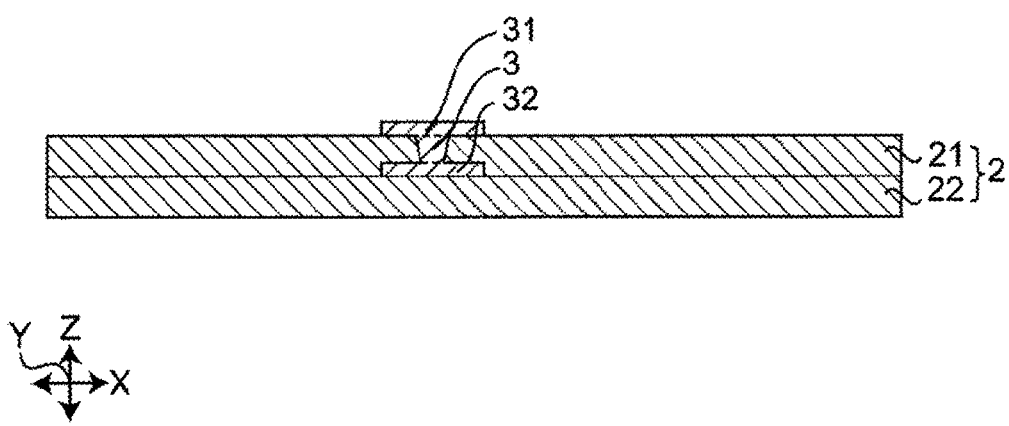
FIG. 2B is a sectional view illustrating a process following FIG. 2A.

Then, as shown in FIG. 2B, the insulating layer 21 and the insulating layer 22 are stacked to contact the conductive paste 3a with the surface conductor 32, and the insulating layer 21 and the insulating layer 22 are joined by pressure press or the like to provide a flexible substrate 2. At this time, the conductive paste 3a filled in the via hole is also heated and cured to become the interlayer connecting conductor 3. With this, the surface conductor 31 and the surface conductor 32 are joined with the interlayer connecting conductor 3 provided therebetween.

Note that at this time, the insulating layer 21, 22 are firmly adhered and integrated to each other by using a thermoplastic resin as a material of the insulating layer 21, 22. With this, even when the flexible substrate 2 is bent and curved in a U shape, the delamination is able to be further significantly reduced or prevented. In addition, since the insulating layers 21 and 22 are directly stacked without including different types of resin layers, for example, an adhesive layer, an interface between different insulating layers is not provided, and delamination is further significantly reduced or prevented.

Figure 2C:
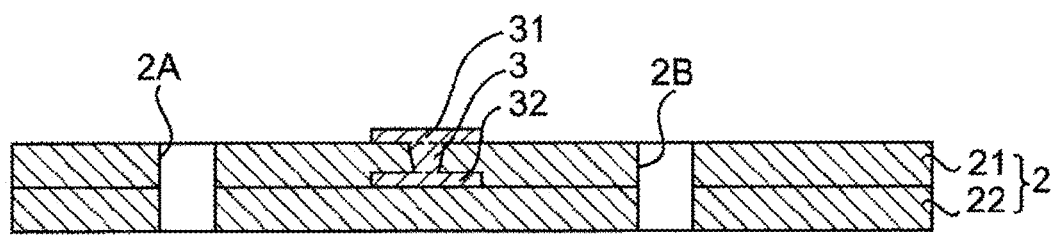
FIG. 2C is a sectional view illustrating a process following FIG. 2B.

Next, a pair of through-holes 2A and 2B is provided at positions opposing each other with the interlayer connecting conductor 3 provided therebetween in a plan view by laser processing or the like as shown in FIG. 2C.

Figure 2D:
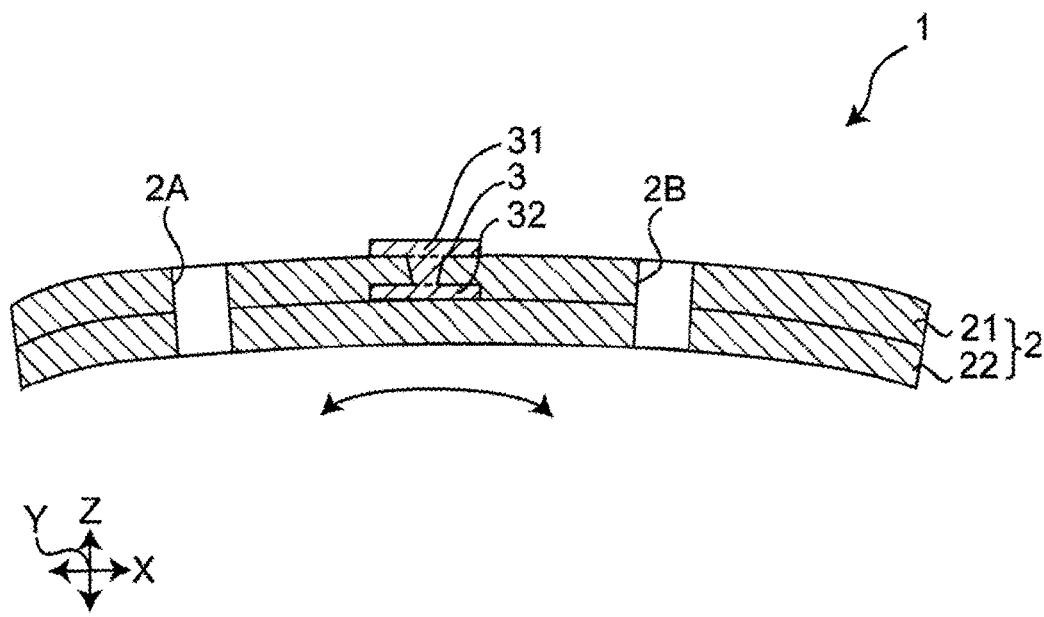
FIG. 2D is a sectional view illustrating a process following FIG. 2C.

Next, the flexible substrate 2 is placed in a press mold, heated and pressurized, and bent to curve the flexible substrate 2 into a U shape as shown in FIG. 2D. The curvature radius r1 of the inner region P may be larger than the curvature radii r2 and r3 of the outer regions Q and R, respectively, as shown in FIG. 1B according to the curvature radius of the concave or convex portion included in the press mold. As described above, the multilayer board 1 illustrated in FIGS. 1A and 1B is able to be manufactured.

According to the present first preferred embodiment, by providing the pair of through-holes 2A and 2B that penetrate the plurality of insulating layers 21 and 22, the outer regions Q and R are able to bend more easily as compared with the inner region P located between the pair of through-holes 2A and 2B. That is, since the outer regions Q and R are easily bent, the inner region P is less likely to bend, and the bending stress applied to the inner region P is able to be relaxed. By providing the interlayer connecting conductor 3 in the opposing region E1 in which the pair of through-holes 2A and 2B opposes each other, the relaxation of the bending stress applied to the interlayer connecting conductor 3 is able to be provided in a significantly reduced space compared to International Patent Publication No. WO 2013/114975 A1. In addition, since the bending stress applied to the interlayer connecting conductor 3 is able to be relaxed, a decrease in the connection reliability of the interlayer connecting conductor 3 is able to be significantly reduced or prevented. In addition, forming the through-holes 2A and 2B to penetrate the plurality of insulating layers 21 and 22 is easier in machining as compared with the case of providing the holes not penetrating the plurality of insulating layers 21 and 22.

In addition, according to the present first preferred embodiment, the interlayer connecting conductor 3 is provided in the intermediate portion of the opposing region E1. Accordingly, the bending stress applied to the interlayer connecting conductor 3 is able to be further relaxed, and the decrease in the connection reliability of the interlayer connecting conductor 3 is able to be further significantly reduced or prevented.

In addition, according to the present first preferred embodiment, curvature radius r1 of the inner region P is larger than the curvature radii r2 and r3 of the outer regions Q and R. Accordingly, for example, when the multilayer board 1 is further bent and mounted on an object to be connected, the bending force applied to the multilayer board 1 is able to be further reduced.

In addition, according to the present first preferred embodiment, the pair of through-holes 2A and 2B is defined by slits having a longitudinal direction in the Y direction. Accordingly, since the area of the opposing region E1 in which a pair of through-holes 2A and 2B opposes each other is able to be increased, the bending stress applied to the interlayer connecting conductor 3 is able to be further relaxed and the deterioration of the connection reliability of the interlayer connecting conductor 3 is able to be further significantly reduced or prevented.

In addition, according to the present first preferred embodiment, the longitudinal directions of the pair of through-holes 2A and 2B are parallel or substantially parallel to each other. Accordingly, since the area of the opposing region E1 in which a pair of through-holes 2A and 2B opposes each other is able to be increased, the bending stress applied to the interlayer connecting conductor 3 is able to be further relaxed and the deterioration of the connection reliability of the interlayer connecting conductor 3 is able to be further significantly reduced or prevented.

Note that both of the pair of through-holes 2A and 2B are defined by slits having a longitudinal direction in the Y direction in the first preferred embodiment, but the present invention is not limited thereto. For example, at least one of the pair of through-holes 2A and 2B may be defined by a slit having a longitudinal direction in the Y direction. Even in this case, the same or similar effect is able to be provided.

Figure 3:
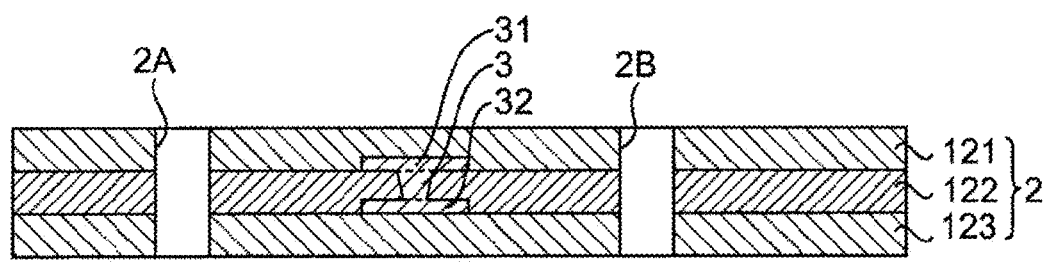
FIG. 3 is a sectional view illustrating a first modified example of the multilayer board according to the first preferred embodiment of the present invention.
Figure 3:

In addition, in the first preferred embodiment, the flexible substrate 2 preferably includes two insulating layers 21 and 22, but the present invention is not limited thereto. The flexible substrate 2 may include the insulating layers having three layers or more. For example, the flexible substrate 2 may be defined by insulating layers 121, 122, and 123 as illustrated in FIG. 3. Accordingly, the interlayer connecting conductor 3 may penetrate the intermediate insulating layer 122 among the three insulating layers 121, 122 and 123 as illustrated in FIG. 3. Accordingly, the stress applied to the interlayer connecting conductor 3 becomes smaller as compared with the case where the interlayer connecting conductor 3 penetrates the insulating layer 121 or insulating layer 123 on the outer side. In addition, for example, a flexible substrate 2 may be defined by the insulating layers having 10 layers or more. Accordingly, it is difficult to curve the flexible substrate with a conventional structure, but according to the multilayer board 1 according to the first preferred embodiment, since the pair of through-holes 2A and 2B is provided, the flexible substrate 2 is able to be curved more easily.

Figure 4:
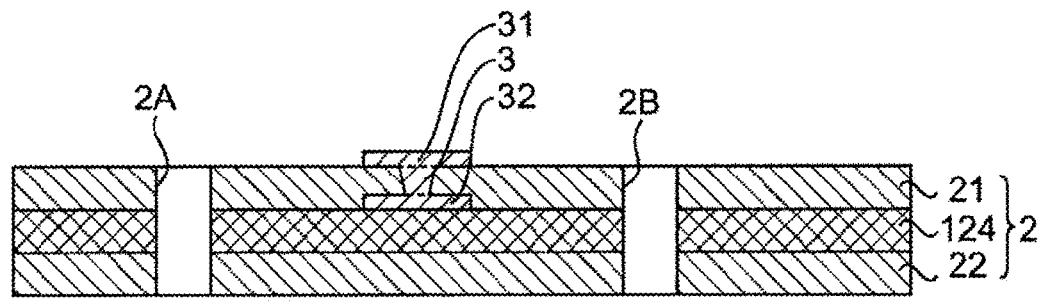
FIG. 4 is a sectional view illustrating a second modified example of the multilayer board according to the first preferred embodiment of the present invention.
Figure 4:
Figure 5:
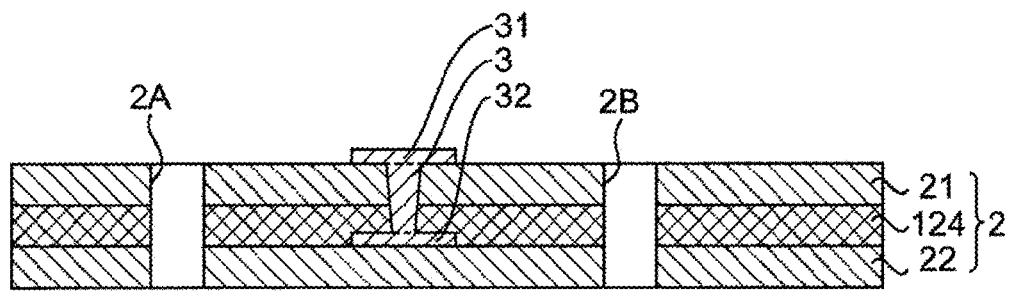
FIG. 5 is a sectional view illustrating a third modified example of the multilayer board according to the first preferred embodiment of the present invention.
Figure 5:

In addition, the insulating layers 21 and 22 are firmly adhered to each other and integrated to significantly reduce or prevent delamination by using the same or similar type of resin layer (thermoplastic resin) as the material of the insulating layers 21 and 22 in the first preferred embodiment, but the present invention is not limited thereto. For example, the insulating layers 21 and 22 may be stacked with an adhesive layer 124 which is a resin layer of a different type from the insulating layers 21 and 22 provided therebetween as shown in FIGS. 4 and 5. Accordingly, the interlayer connecting conductor 3 may penetrate the insulating layer 21 as illustrated in FIG. 4. In addition, the interlayer connecting conductor 3 may penetrate the insulating layer 21 and the adhesive layer 124 as shown in FIG. 5. Even in these cases, since the pair of through-holes 2A and 2B penetrates the plurality of insulating layers 21 and 22, the bending stress applied to the interlayer connecting conductor 3 is able to be relaxed, and the decrease in the connection reliability of the interlayer connecting conductor 3 is able to be significantly reduced or prevented.

In addition, one interlayer connecting conductor 3 is provided in the opposing region E1 in the first preferred embodiment, but the present invention is not limited thereto. For example, the opposing region E1 may be provided with two or more interlayer connecting conductors 3. Even in this case, the bending stress applied to each interlayer connecting conductor 3 is able to be relaxed, and the decrease in the connection reliability of each interlayer connecting conductor 3 is able to be significantly reduced or prevented.

In addition, in the first preferred embodiment, the interlayer connecting conductor 3 is illustrated as a filled via filled in a via hole penetrating the insulating layer 21, but the present invention is not limited thereto. For example, the interlayer connecting conductor 3 may include a hollow via provided in a tubular shape along the inner peripheral surface of a via hole penetrating the insulating layer 21. Since the hollow via has a thin wall thickness, cracking, peeling or the like is more likely to occur than the filled via.

In contrast, according to the present first preferred embodiment, since a pair of through-holes 2A and 2B is provided at positions opposing each other with the interlayer connecting conductor 3 provided therebetween, the bending stress applied to the interlayer connecting conductor 3 is able to be relaxed to significantly reduce or prevent the occurrence of cracking, peeling or the like. As a result, a decrease in the connection reliability of the interlayer connecting conductor 3 is able to be further significantly reduced or prevented.

In addition, the surface conductors 31 and 32 are also provided in the opposing region E1 in the first preferred embodiment, but the present invention is not limited thereto.

For example, the surface conductors 31 and 32 may be a large-area electrode or wiring pattern having a portion extending to the outside of the opposing region E1.

Figure 6:
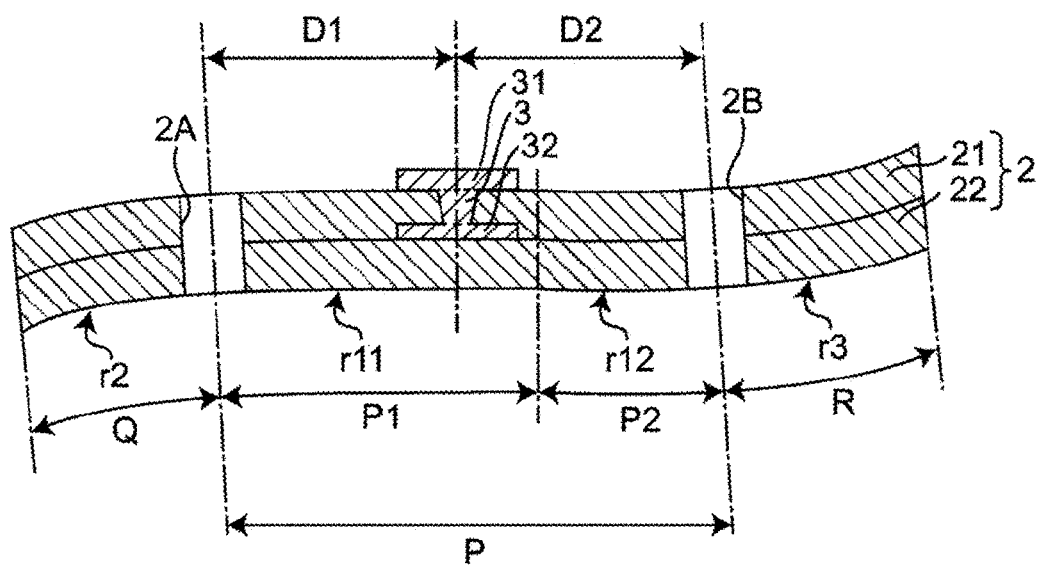
FIG. 6 is a sectional view illustrating a fourth modified example of the multilayer board according to the first preferred embodiment of the present invention.
Figure 6:

Further, in the first preferred embodiment, a cross section of the flexible substrate 2 taken in the X direction and the Z direction is curved in a U shape, but the present invention is not limited thereto. For example, the cross section of the flexible substrate 2 taken in the X direction and Z direction is curved in an S shape (including Z shape) as shown in FIG. 6. Accordingly, the inner region P is curved and the curving direction is different with the middle of the inner region in the Y direction as the inflection portion. Here, as an example, the inflection portion may be closer to the through-hole 2B than the interlayer connecting conductor 3 in the inner region P. The inner region P1 may be located closer to the outer region Q side from the inflection portion is curved upward in the Z direction, and the inner region P2 located closer to the outer region R side from the inflection portion is curved downward in the Z direction. In the cross section illustrated in FIG. 6, the curvature radii r11 and r12 of the inner regions P1 and P2 located between the pair of through-holes 2A and 2B are larger than the curvature radii r2 and r3 of the outer regions Q and R adjacent to the pair of through-holes 2A and 2B on the outside thereof, respectively (r11, r12>r2, r3). In other words, the curvature radius of the inner region P is larger than the curvature radius of the outer regions Q and R. Accordingly, for example, when the multilayer board 1 is further bent and mounted on an object to be connected, the bending force applied to the multilayer board 1 is able to be further reduced.

Figure 7:
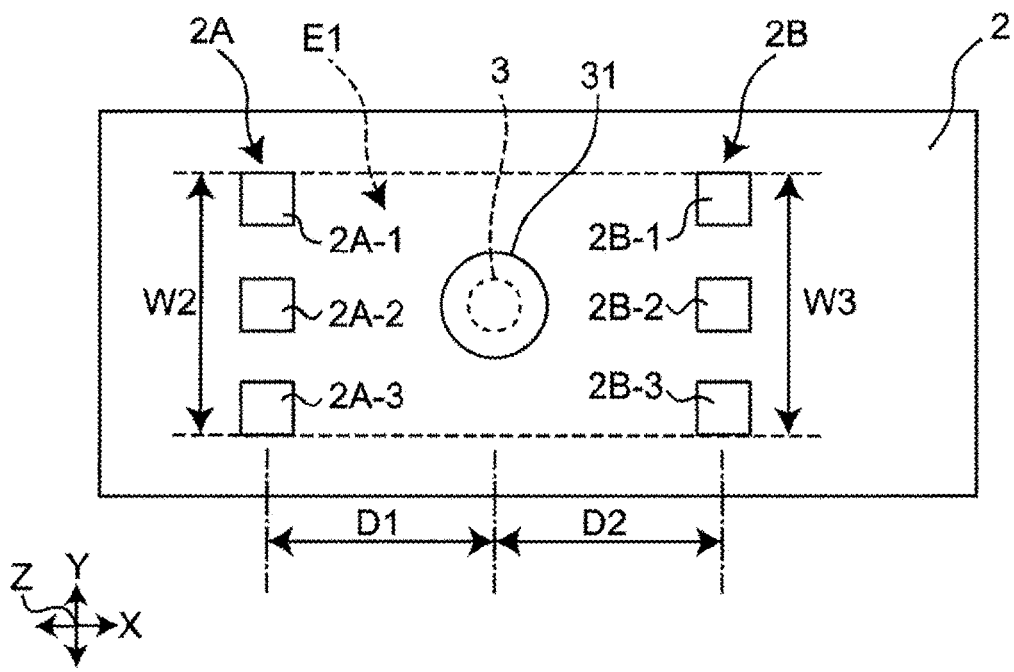
FIG. 7 is a plan view illustrating a multilayer board according to a second preferred embodiment of the present invention.

FIG. 7 is a plan view illustrating a multilayer board according to a second preferred embodiment of the present invention.

The difference between the multilayer board according to the present second preferred embodiment and the multilayer board according to the first preferred embodiment is that the through-holes 2A and 2B are each divided into a plurality of holes and located at intervals in the Y direction in a plan view.

In the preset second preferred embodiment, the through-hole 2A is defined by three divided holes 2A-1, 2A-2, and 2A-3. The divided holes 2A-1, 2A-2, and 2A-3 are preferably square or substantially square, and positioned along the Y direction at intervals from each other. The distance from the outer end portion of the divided hole 2A-1 in the Y direction to the outer end portion of the divided hole 2A-3 in the Y direction corresponds to the length W2 in the longitudinal direction of the through-hole 2A of the first preferred embodiment.

Similarly, in the present second preferred embodiment, the through-hole 2B includes three divided holes 2B-1, 2B-2, and 2B-3. The divided holes 2B-1, 2B-2, and 2B-3 are preferably square or substantially square and positioned along the Y direction at intervals from each other. The distance from the outer end portion of the divided hole 2B-1 in the Y direction to the outer end portion of the divided hole 2B-3 in the Y direction corresponds to the length W3 in the longitudinal direction of the through-hole 2B of the first preferred embodiment.

According to the second preferred embodiment, the positions of the through-holes 2A and 2B are able to be easily designed in consideration of the strength calculation, and the through-holes 2A and 2B are able to also be machined relatively easily. As a result, a decrease in mechanical strength is able to be significantly reduced or prevented due to the through-holes while ensuring the flexibility of the multilayer board.

Note that in the second preferred embodiment, each of the through-holes 2A and 2B includes three divided holes, but the present invention is not limited thereto. For example, through-holes 2A and 2B may include two divided holes, or may include four or more divided holes.

In addition, both of the pair of through-holes 2A and 2B include a plurality of divided holes in the second preferred embodiment, but the present invention is not limited thereto. For example, at least one of the pair of through-holes 2A and 2B may include a plurality of divided holes. Even in this case, the same or similar effects are able to be provided.

In addition, each divided hole is provided in a square shape in the second preferred embodiment, but the present invention is not limited thereto. For example, each divided hole may be circular, elliptical, rectangular, substantially one of these shapes, or the like.

Figure 8:
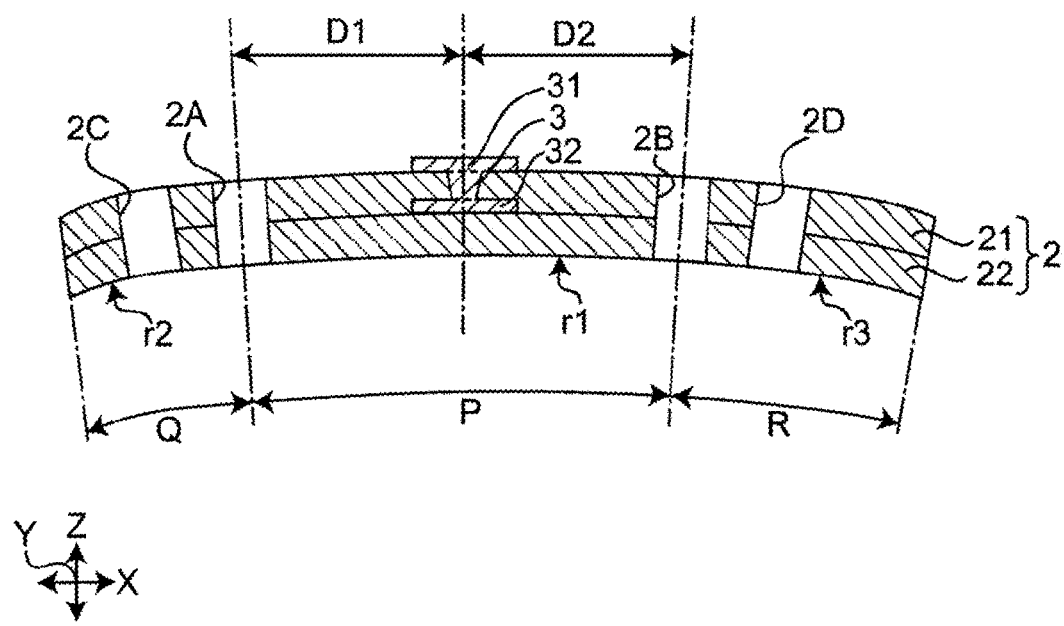
FIG. 8 is a sectional view illustrating a multilayer board according to a third preferred embodiment of the present invention.

FIG. 8 is a sectional view illustrating a multilayer board according to a third preferred embodiment of the present invention.

The difference of the multilayer board according to the present third preferred embodiment from the multilayer board according to the first preferred embodiment is that another pair of through-holes 2C and 2D different from the pair of through-holes 2A and 2B is provided in the flexible substrate 2.

The pair of through-holes 2C and 2D penetrate the insulating layers 21 and 22. In addition, the pair of through-holes 2C and 2D oppose each other with the pair of through-holes 2A and 2B and the interlayer connecting conductor 3 provided therebetween in the X direction in a plan view.

According to the present third preferred embodiment, the outer regions Q and R is able to be bent more easily than the inner region P, and the bending stress applied to the interlayer connecting conductor 3 is able to be further relaxed. As a result, a decrease in the connection reliability of the interlayer connecting conductor 3 is able to be further significantly reduced or prevented.

Note that in the third preferred embodiment, the pair of through-holes 2C and 2D oppose each other in the X direction with the interlayer connecting conductor 3 provided therebetween, but the present invention is not limited thereto. For example, a plurality of pairs of through-holes may oppose each other in the X direction with the interlayer connecting conductor 3 provided therebetween.

Figure 9:
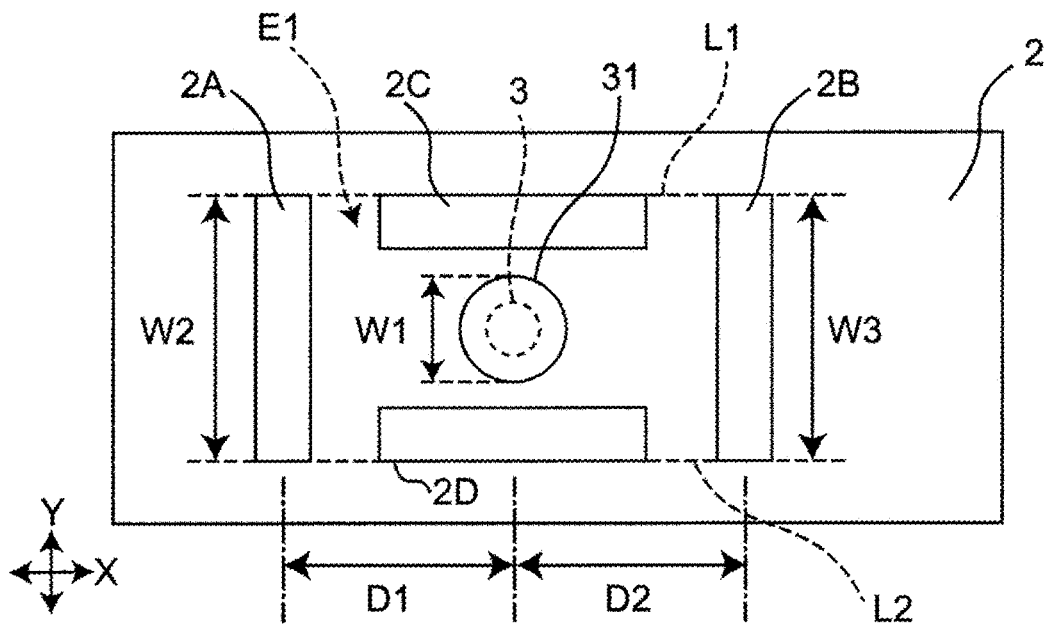
FIG. 9 is a plan view illustrating a multilayer board according to a fourth preferred embodiment of the present invention.

FIG. 9 is a plan view illustrating a multilayer board according to a fourth preferred embodiment of the present invention.

The difference between the multilayer board according to the fourth preferred embodiment and the multilayer board according to the third preferred embodiment is that the pair of through-holes 2C and 2D oppose each other with the interlayer connecting conductor 3 provided therebetween in the Y direction in a plan view. That is, the interlayer connecting conductor 3 is provided in an opposing region in which a pair of through-holes 2C and 2D opposes each other in a plan view.

According to the present fourth preferred embodiment, even if the flexible substrate 2 is bent about the X direction, the bending stress applied to the interlayer connecting conductor 3 is able to be relaxed. In addition, for example, even when the flexible substrate 2 is bent and twisted (in the direction intersecting the X direction and the Y direction), the bending stress applied to the interlayer connecting conductor 3 is able to be relaxed. As a result, a decrease in the connection reliability of the interlayer connecting conductor 3 is able to be further significantly reduced or prevented.

Figure 10:
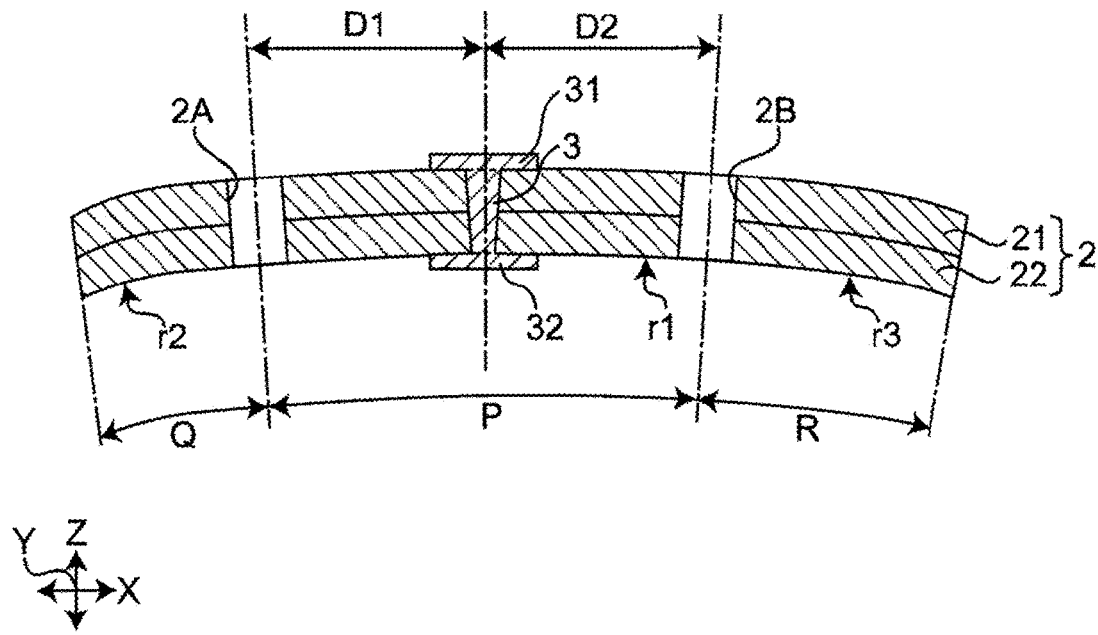
FIG. 10 is a sectional view illustrating a multilayer board according to a fifth preferred embodiment of the present invention.

FIG. 10 is a sectional view illustrating a multilayer board according to a fifth preferred embodiment of the present invention.

The difference between the multilayer board according to the present fifth preferred embodiment and the multilayer board according to the first preferred embodiment is that the surface conductor 32 is provided on the lower surface side of the insulating layer 22, and the interlayer connecting conductor 3 penetrates the insulating layers 21 and 22 in the Z direction to electrically connect the surface conductor 31 and the surface conductor 32. That is, the interlayer connecting conductor 3 is a through-hole via that penetrates the plurality of insulating layers 21 and 22 in the present fifth preferred embodiment.

Since the through-hole via has a long length in the Z direction, cracking, peeling or the like is likely to occur due to bending stress. On the other hand, according to the present fifth preferred embodiment, since the pair of through-holes 2A and 2B is provided at positions opposing each other with the through-hole via provided therebetween, the bending stress applied to the through-hole via over all the layers of the plurality of insulating layers 21 and 22 is able to be relaxed or reduced. As a result, a decrease in the connection reliability of the interlayer connecting conductor 3 is able to be further significantly reduced or prevented.

Figure 11A:
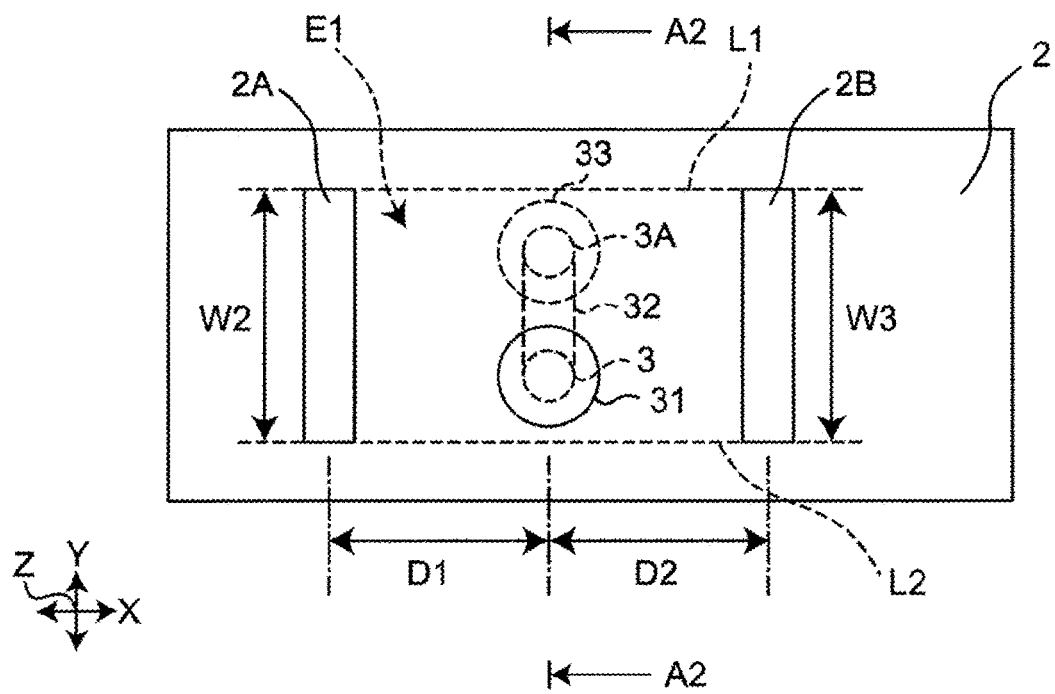
FIG. 11A is a plan view illustrating a multilayer board according to a sixth preferred embodiment of the present invention.
Figure 11B:
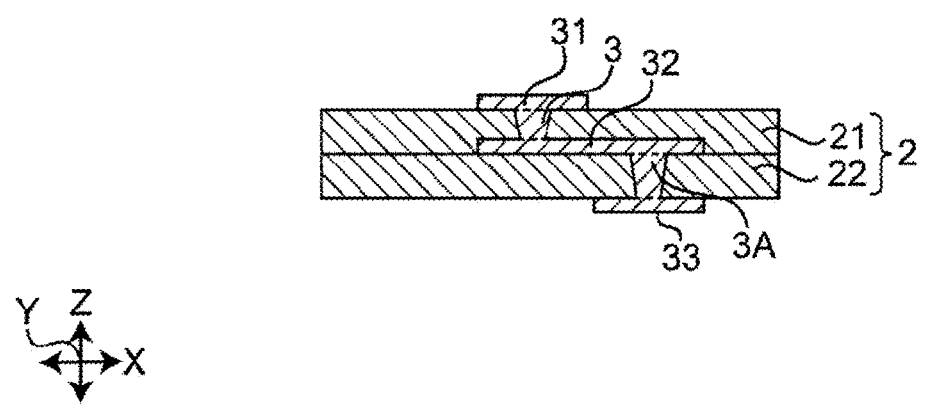
FIG. 11B is a sectional view taken along line A2-A2 of FIG. 11A.

FIG. 11A is a plan view illustrating a multilayer board according to a sixth preferred embodiment of the present invention. FIG. 11B is a sectional view taken along line A2-A2 of FIG. 11A.

The difference between the multilayer board according to the present sixth preferred embodiment and the multilayer board according to the first preferred embodiment is that the interlayer connecting conductor 3A and the surface conductor 33 are further included.

The surface conductor 33 is provided on the lower surface side of the insulating layer 22. The interlayer connecting conductor 3A penetrates the insulating layer 22 in the Z direction to electrically connect the surface conductor 32 and the surface conductor 33. The interlayer connecting conductor 3 and the interlayer connecting conductor 3A are offset in the Y direction in a plan view. In a plan view, the outer shapes of the surface conductor 33 and the interlayer connecting conductor 3A are provided in, for example, a circle, a square, a rectangle, or substantially one of these shapes. In the present second preferred embodiment, the outer shapes of the surface conductor 33 and the interlayer connecting conductor 3A are circular. In a plan view, the outer shape of the surface conductor 33 is larger than the outer shape of the interlayer connecting conductor 3A and includes the interlayer connecting conductor 3A.

In addition, in the present sixth preferred embodiment, the surface conductor 32 defines and functions as a connecting conductor that connects the interlayer connecting conductor 3 and the interlayer connecting conductor 3A. The outer shape of the surface conductor 32 is elliptical or substantially elliptical.

According to the present sixth preferred embodiment, since the interlayer connecting conductors 3 and 3A are offset in the Y direction, the bending stress applied to the interlayer connecting conductors 3 and 3A is able to be dispersed. In addition, for example, even when the flexible substrate 2 is bent and twisted (in the direction intersecting the X direction and the Y direction), the bending stress applied to the interlayer connecting conductors 3 and 3A is able to be relaxed. As a result, a decrease in the connection reliability of the interlayer connecting conductors 3 and 3A is able to be further significantly reduced or prevented.

Figure 12A:
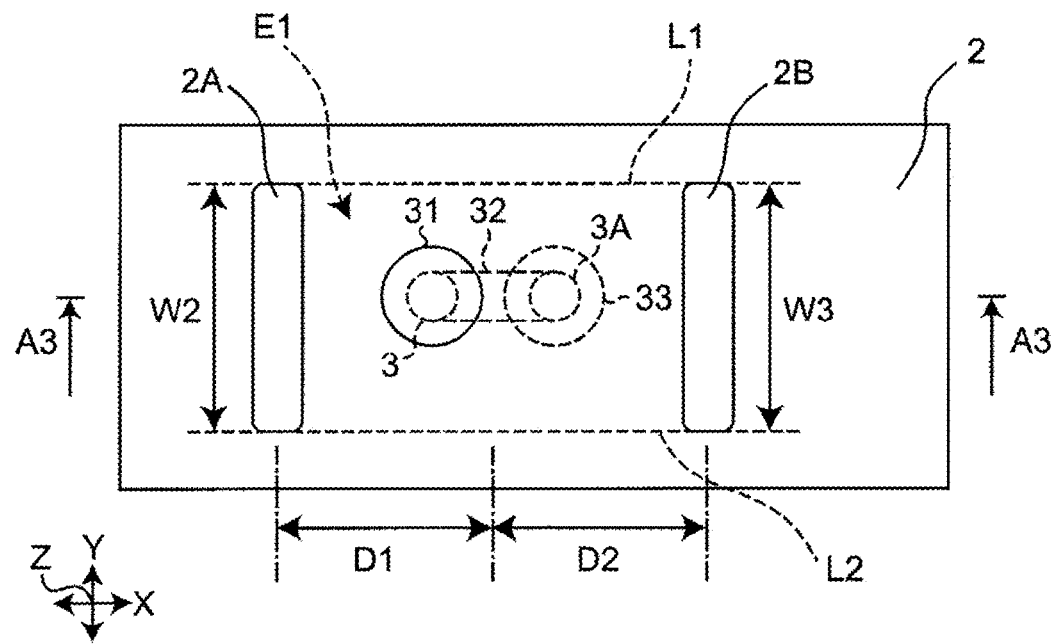
FIG. 12A is a plan view illustrating a multilayer board according to a seventh preferred embodiment of the present invention.
Figure 12B:
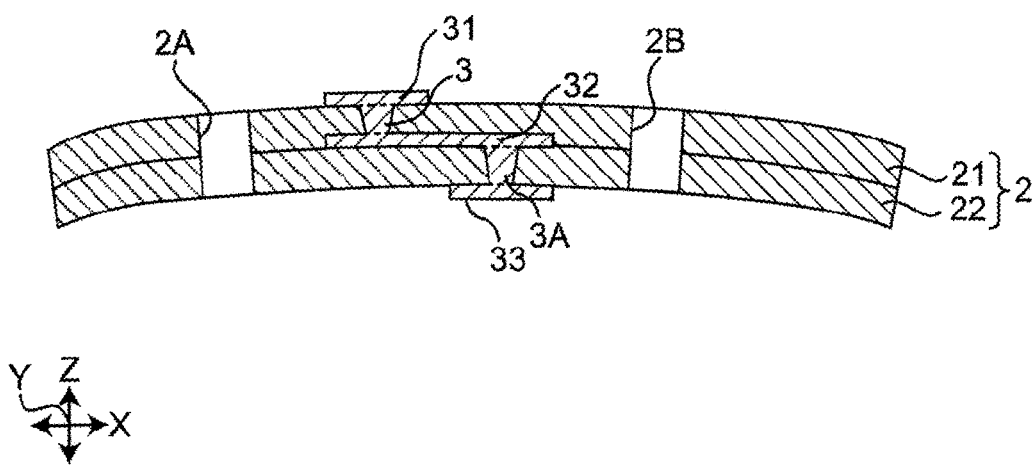
FIG. 12B is a sectional view taken along line A3-A3 of FIG. 12A.

FIG. 12A is a plan view illustrating a multilayer board according to a seventh preferred embodiment of the present invention. FIG. 12B is a sectional view taken along line A3-A3 of FIG. 12A.

The difference between the multilayer board according to the present seventh preferred embodiment and the multilayer board according to the sixth preferred embodiment is that the interlayer connecting conductor 3 and the interlayer connecting conductor 3A are offset in the X direction. In addition, the difference is that each corner portion of the through-holes 2A and 2B is rounded.

According to the present seventh preferred embodiment, since the interlayer connecting conductors 3 and 3A are offset in the X direction, the bending stress applied to the interlayer connecting conductors 3 and 3A is able to be dispersed. As a result, a decrease in the connection reliability of the interlayer connecting conductors 3 and 3A is able to be further significantly reduced or prevented.

In addition, according to the present seventh preferred embodiment, since each corner portions of the through-holes 2A and 2B is rounded, the stress concentration on each corner portion is able to significantly reduced and the damage to the flexible substrate 2 is able to be significantly reduced or prevented.

Figure 13:
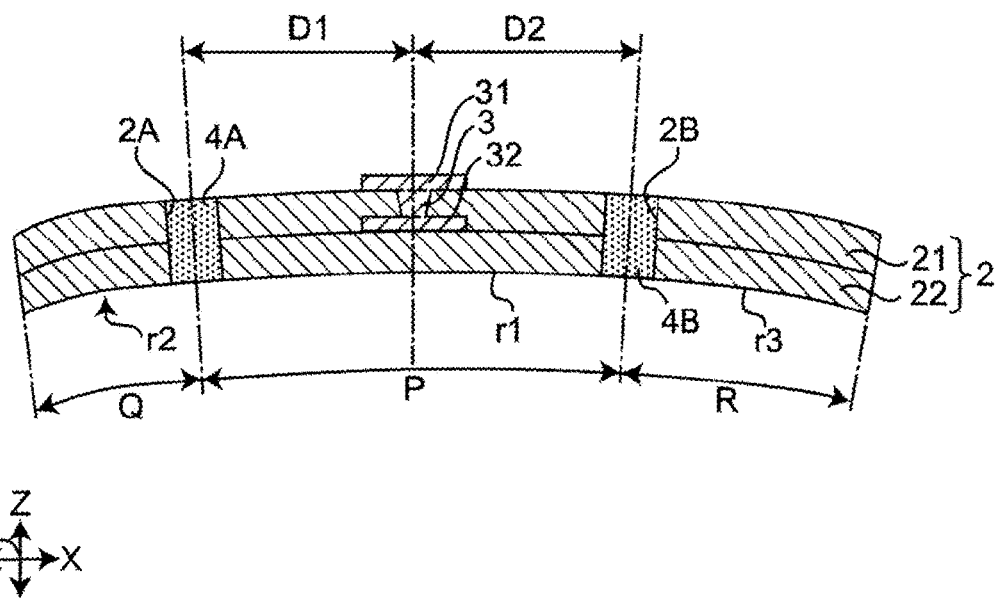
FIG. 13 is a sectional view illustrating a multilayer board according to an eighth preferred embodiment of the present invention.

FIG. 13 is a sectional view illustrating a multilayer board according to an eighth preferred embodiment of the present invention.

The difference between the multilayer board according to the present eighth preferred embodiment and the multilayer board according to the first preferred embodiment is that the elastic bodies 4A and 4B having a lower elastic modulus than the elastic modulus of the insulating layers 21 and 22 are located in the pair of through-holes 2A and 2B.

The elastic bodies 4A and 4B are, for example, a resin material such as a silicone resin or a rubber material such as an elastomer. In the present seventh preferred embodiment, the elastic bodies 4A and 4B are filled and in close contact with the through-holes 2A and 2B, respectively.

According to the present eighth preferred embodiment, since the elastic bodies 4A and 4B having an elastic modulus lower than the elastic modulus of the insulating layers 21 and 22 are located in the pair of through-holes 2A and 2B, damage to the surrounding portions of the through-holes 2A and 2B when bending stress is applied is able to be significantly reduced or prevented.

Figure 14:
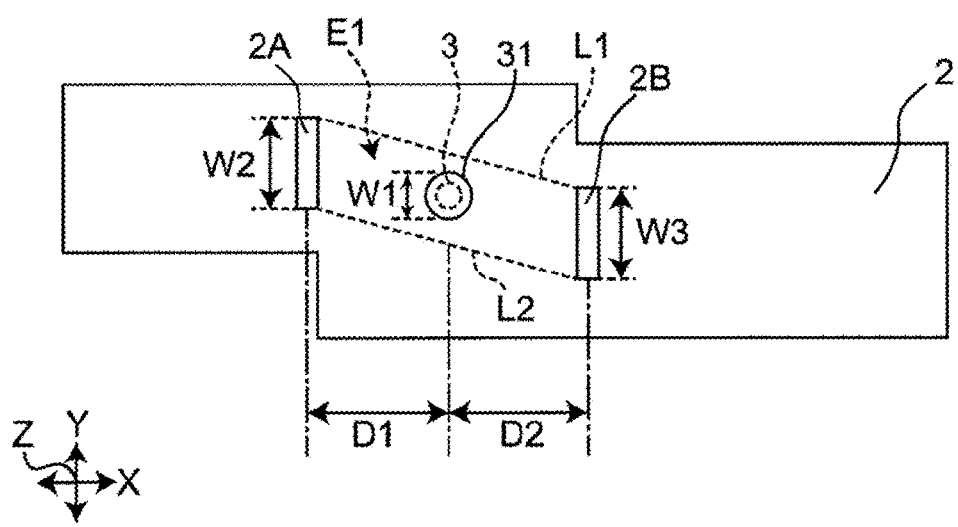
FIG. 14 is a plan view illustrating a multilayer board according to a ninth preferred embodiment of the present invention.

FIG. 14 is a plan view showing a multilayer board according to a ninth preferred embodiment of the present invention.

The difference between the multilayer board according to the present ninth preferred embodiment and the multilayer board according to the first preferred embodiment is that the pair of through-holes 2A and 2B is offset in the Y direction. In addition, in the present ninth preferred embodiment, the flexible substrate 2 is provided in a shape to be offset in the X direction and the Y direction (a substantially Z-shape) with each of two rectangular or substantially rectangular portions overlapped in a plan view.

Even in the multilayer board according to the present ninth preferred embodiment, since the interlayer connecting conductor 3 is provided in the opposing region E1 opposing the pair of through-holes 2A and 2B, the bending stress applied to the interlayer connecting conductor 3 is able to be dispersed. In addition, for example, even when the flexible substrate 2 is bent and twisted (in the direction in which the pair of through-holes 2A and 2B opposes each other), the bending stress applied to the interlayer connecting conductor 3 is able to be relaxed. As a result, a decrease in the connection reliability of the interlayer connecting conductor 3 is able to be further significantly reduced or prevented.

Note that in the multilayer board according to the ninth preferred embodiment, the directions in which the pair of through-holes 2A and 2B opposes each other are the directions intersecting with the X direction.

Figure 15:
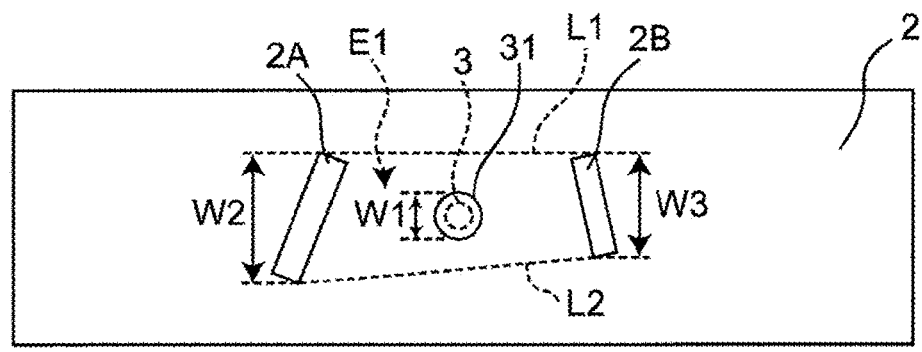
FIG. 15 is a plan view illustrating a multilayer board according to a tenth preferred embodiment of the present invention.

FIG. 15 is a plan view illustrating a multilayer board according to a tenth preferred embodiment of the present invention.

The difference between the multilayer board according to the present tenth preferred embodiment and the multilayer board according to the first preferred embodiment is that the pair of through-holes 2A and 2B is provided oblique (non-parallel) with longitudinal directions intersecting with respect to the X and Y directions. In addition, the pair of through-holes 2A and 2B is provided with their lengths in the longitudinal direction being different from each other.

Even in the multilayer board according to the present tenth preferred embodiment, since the interlayer connecting conductor 3 is provided in the opposing region E1 opposing the pair of through-holes 2A and 2B, the bending stress applied to the interlayer connecting conductor 3 is able to be relaxed. As a result, a decrease in the connection reliability of the interlayer connecting conductor 3 is able to be further significantly reduced or prevented.

Figure 16:
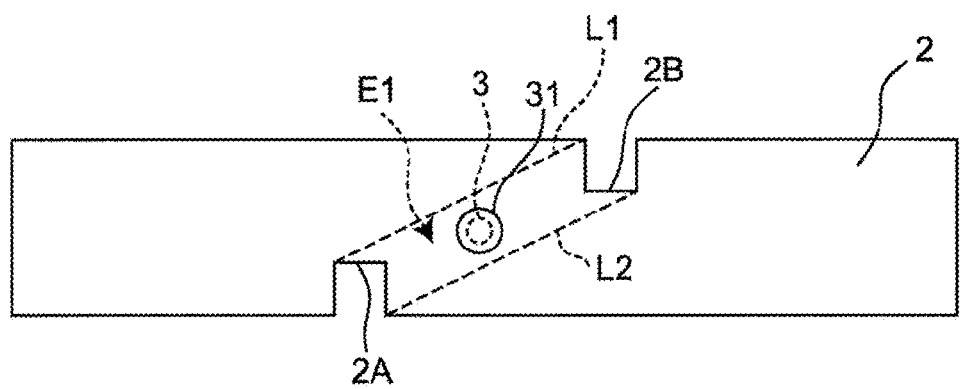
FIG. 16 is a plan view illustrating a multilayer board according to an eleventh preferred embodiment of the present invention.

FIG. 16 is a plan view illustrating a multilayer board according to an eleventh preferred embodiment of the present invention.

The difference between the multilayer board according to the present eleventh preferred embodiment and the multilayer board according to the first preferred embodiment is that the pair of through-holes 2A and 2B is provided to extend inward from both edge portions of the flexible substrate 2 in the Y direction.

Even in the multilayer board according to the present eleventh preferred embodiment, since the interlayer connecting conductor 3 is provided in the opposing region E1 opposing the pair of through-holes 2A and 2B, the bending stress applied to the interlayer connecting conductor 3 is able to be relaxed. As a result, a decrease in the connection reliability of the interlayer connecting conductor 3 is able to be further significantly reduced or prevented.

Note that in the multilayer board according to the eleventh preferred embodiment, the lateral direction passing through the pair of through-holes 2A and 2B and the interlayer connecting conductor 3 is a direction intersecting with the X direction.

Figure 17A:
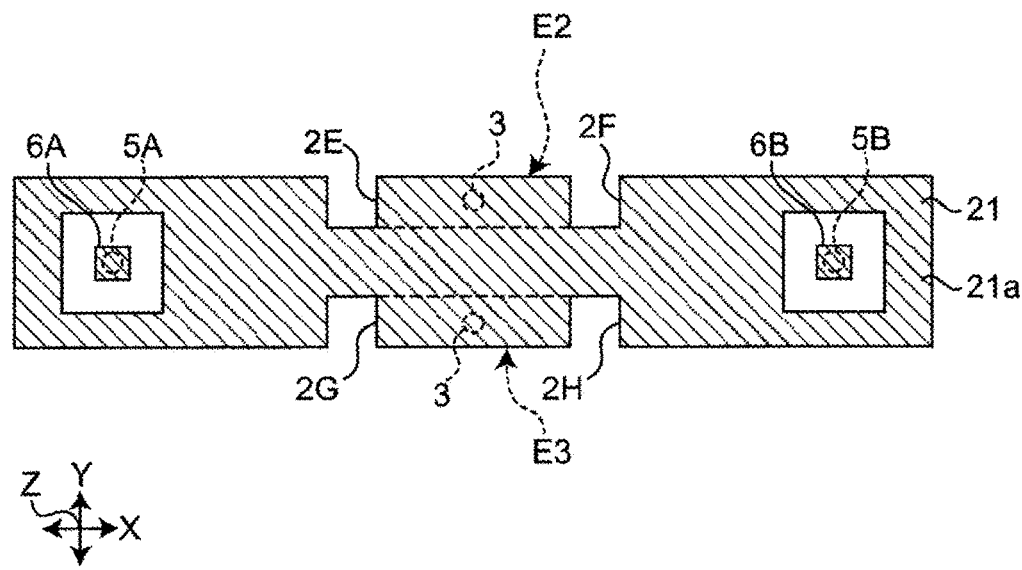
FIG. 17A is a plan view illustrating an upper insulating layer of the multilayer board according to a twelfth preferred embodiment of the present invention.
Figure 17B:
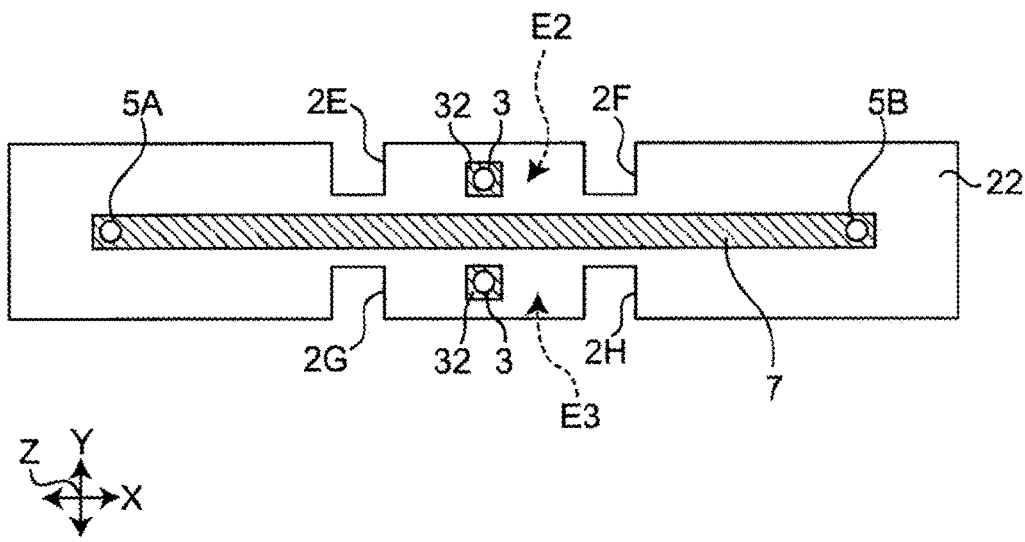
FIG. 17B is a plan view illustrating the intermediate insulating layer of the multilayer board according to the twelfth preferred embodiment of the present invention.
Figure 17C:
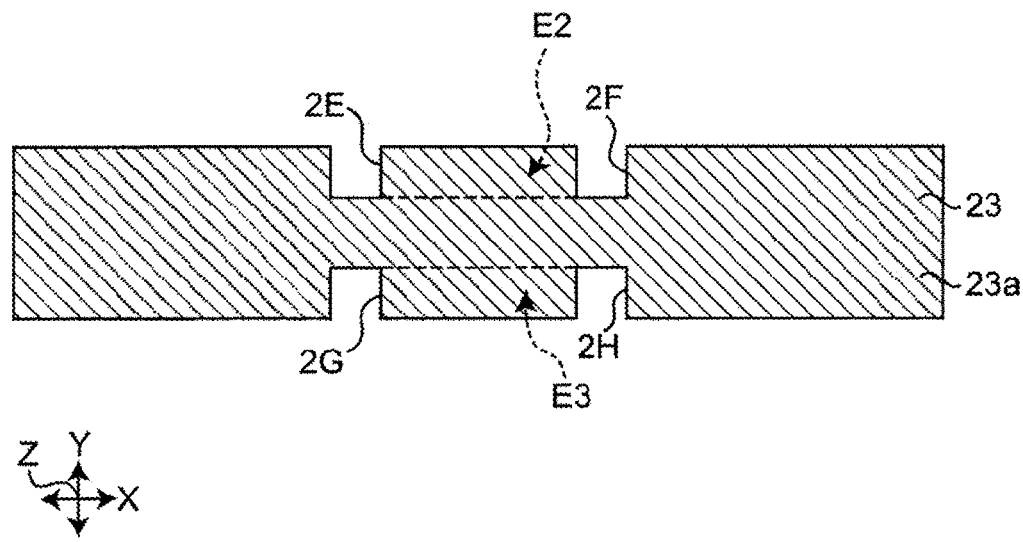
FIG. 17C is a plan view illustrating the lower insulating layer of the multilayer board according to the twelfth preferred embodiment of the present invention.

FIGS. 17A to 17C are plan views illustrating a multilayer board according to a twelfth preferred embodiment of the present invention.

The difference between the multilayer board according to the present twelfth preferred embodiment and the multilayer board according to the first preferred embodiment is that three insulating layers 21, 22, and 23 are included, and a pair of through-holes 2E and 2F and a pair of through-holes 2G and 2H penetrate each of the insulating layers 21, 22, and 23.

In the twelfth preferred embodiment, the pair of through-holes 2E and 2F extends inward from one edge portion of the flexible substrate 2 in the Y direction. In a plan view, one interlayer connecting conductor 3 is provided in the opposing region E2 where the pair of through-holes 2E, 2F is opposed to each other.

Similarly, the pair of through-holes 2G, 2H extends inward from the other edge portion of the flexible substrate 2 in the Y direction. One interlayer connecting conductor 3 is provided in an opposing region E3 where the pair of through-holes 2G, 2H opposes each other in a plan view.

The two interlayer connecting conductors 3 provided in the opposing regions E2 and E3 electrically connect a conductor pattern 21a provided on the upper surface side of the insulating layer 21 and a conductor pattern 23a provided on the upper surface side of the insulating layer 23.

A pair of interlayer connecting conductors 5A and 5B is provided in a region outside the pair of through-holes 2E and 2F and the pair of through-holes 2G and 2H in the X direction. A pair of interlayer connecting conductors 5A and 5B is electrically connected to the terminal portions 6A and 6B provided on the upper surface side of the insulating layer 21, and electrically connected to each other with the connecting conductor 7 provided on the upper surface side of the insulating layer 22 provided therebetween.

According to the present twelfth preferred embodiment, the relaxation of the bending stress applied to the interlayer connecting conductor 3 is able to be provided in a significantly reduced space as compared with International Patent Publication No. WO 2013/114975 A1 by providing the interlayer connecting conductor 3 in the opposing regions E2 and E3. In addition, since the bending stress applied to the interlayer connecting conductor 3 is able to be relaxed, a decrease in the connection reliability of the interlayer connecting conductor 3 is able to be significantly reduced or prevented.

Note that in the multilayer board according to the twelfth preferred embodiment, the interlayer connecting conductor 3 may be provided in the opposing region where the through-hole 2E and the through-hole 2H oppose each other, or in the opposing region where the through-hole 2F and the through-hole 2G oppose each other. Even in this case, since the bending stress applied to the interlayer connecting conductor 3 provided in the opposing region is able to be relaxed or reduced, the decrease in the connection reliability of the interlayer connecting conductor 3 is able to be further significantly reduced or prevented.

Figure 18:
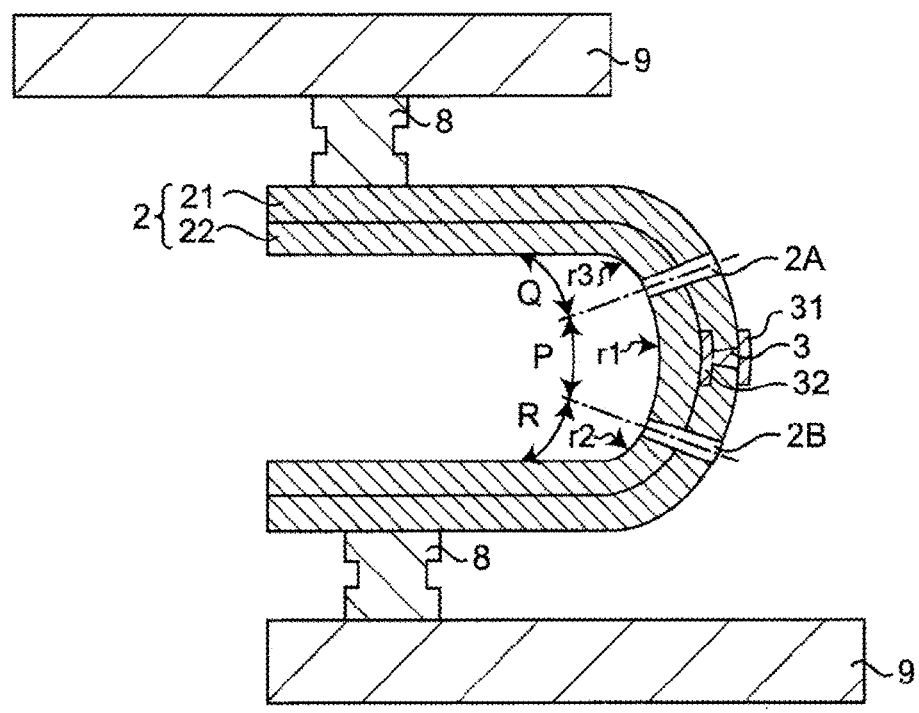
FIG. 18 is a sectional view illustrating the connecting structure of the multilayer board according to a thirteenth preferred embodiment of the present invention.

FIG. 18 is a sectional view illustrating the connecting structure of a multilayer board according to a thirteenth preferred embodiment of the present invention.

The difference between the multilayer board according to the present thirteenth preferred embodiment and the multilayer board according to the first preferred embodiment is that the flexible substrate 2 is bent by about 180 degrees, and both end portions of the flexible substrate 2 in the X direction are stretched with the both end portions of the flexible substrate 2 in the X direction facing each other. Both end portions of the flexible substrate 2 in the X direction are connected to an object to be connected 9, for example, a substrate, with a connector 8 provided therebetween, respectively.

The flexible substrate 2 is attached to the object to be connected 9, and the cross section of the flexible substrate 2 taken in the lateral direction and the stacking direction passing through the pair of through-holes 2A and 2B and the interlayer connecting conductor 3 is curved in a U shape. In addition, the flexible substrate 2 is attached to the object to be connected 9, and the curvature radius r1 of the inner region P located between the pair of through-holes 2A and 2B is larger than the curvature radii r2 and r3 of the outer regions Q and R adjacent to the pair of through-holes 2A and 2B on the outside thereof in the cross section.

According to the present thirteenth preferred embodiment, by providing the pair of through-holes 2A and 2B that penetrate the plurality of insulating layers 21 and 22, the outer regions Q and R are able to bend more easily as compared with the inner region P located between the pair of through-holes 2A and 2B. By providing the interlayer connecting conductor 3 in the opposing region where the pair of through-holes 2A and 2B opposes each other, relaxation of the bending stress applied to the interlayer connecting conductor 3 is able to be provided in a significantly reduced space as compared with International Patent Publication No. WO 2013/114975 A1. In addition, since the bending stress applied to the interlayer connecting conductor 3 is able to be relaxed or reduced, a decrease in the connection reliability of the interlayer connecting conductor 3 is able to be significantly reduced or prevented.

Figure 19:
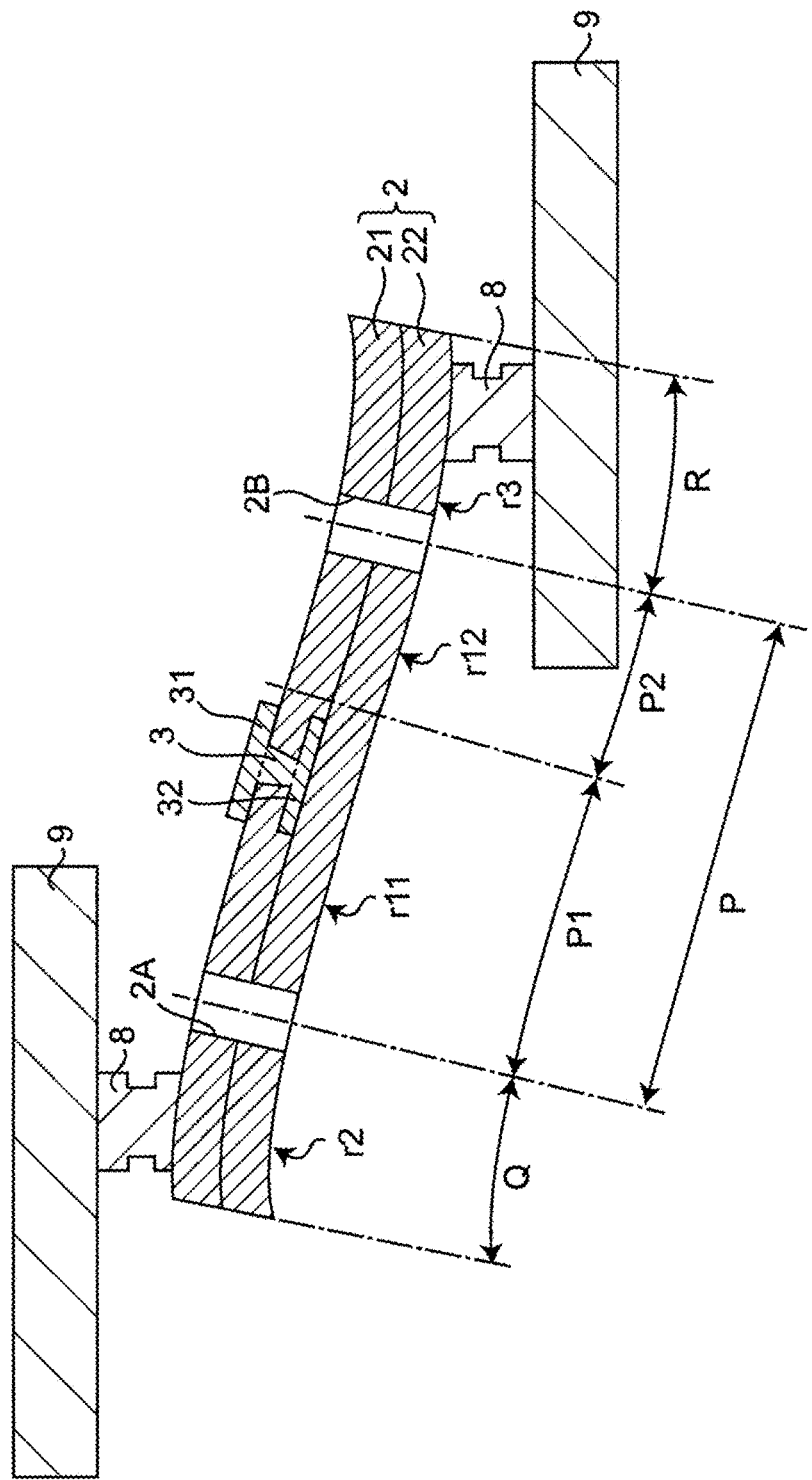
FIG. 19 is a sectional view illustrating the connecting structure of the multilayer board according to a fourteenth preferred embodiment of the present invention.

FIG. 19 is a sectional view illustrating the connection structure of a multilayer board according to a fourteenth preferred embodiment of the present invention.

The difference between the multilayer board according to the present fourteenth preferred embodiment and the multilayer board according to the first preferred embodiment is that the flexible substrate 2 is bent in an S shape or a Z shape. Both end portions of the flexible substrate 2 in the X direction are connected to an object to be connected 9, for example, a substrate, with a connector 8 provided therebetween, respectively.

The flexible substrate 2 is attached to the object to be connected 9, and the cross section of the flexible substrate 2 taken in the lateral direction and the stacking direction passing through the pair of through-holes 2A and 2B and the interlayer connecting conductor 3 is curved in an S shape. In addition, the flexible substrate 2 is attached to the object to be connected 9, and the curvature radii r11 and r12 of the inner regions P1 and P2 located between the pair of through-holes 2A and 2B are larger than the curvature radii r2 and r3 of the outer regions Q and R in the cross section, respectively. In other words, the flexible substrate 2 is attached to the object to be connected 9, and the curvature radius of the inner region P is larger than the curvature radii of the outer regions Q and R.

According to the present fourteenth preferred embodiment, the outer regions Q and R are able to bend more easily than the inner regions P1 and P2 located between the pair of through-holes 2A and 2B by providing the pair of through-holes 2A and 2B that penetrate the plurality of insulating layers 21 and 22. By providing the interlayer connecting conductor 3 in the opposing region where the pair of through-holes 2A and 2B opposes each other, relaxation of the bending stress applied to the interlayer connecting conductor 3 is able to be provided in a significantly reduced space as compared with International Patent Publication No. WO 2013/114975 A1. In addition, since the bending stress applied to the interlayer connecting conductor 3 is able to be relaxed, a decrease in the connection reliability of the interlayer connecting conductor 3 is able to be significantly reduced or prevented.

Note that by appropriately combining any of the various preferred embodiments described above, the effects included in each preferred embodiment are able to be provided.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer board, comprising:
   a flexible substrate that includes a plurality of insulating layers stacked and a pair of through-holes penetrating the plurality of insulating layers; and
   an interlayer connecting conductor provided in an opposing region in which the pair of through-holes oppose each other in a plan view of the plurality of insulating layers viewed from a stacking direction; wherein
   a cross section of the flexible substrate taken in a lateral direction passing through the pair of through-holes and the interlayer connecting conductor and the stacking direction is curved in a U shape or an S shape;
   in the cross section, a curvature radius of an inner region located between the pair of through-holes is larger than a curvature radius of an outer region adjacent to the pair of through-holes on an outer side thereof;
   in the cross section, a length dimension of each of the pair of through holes is different from a direction of curvature of the flexible substrate; and
   in the plan view of the plurality of insulating layers, the length dimension is a longest dimension of each of the pair of through holes.

2. The multilayer board according to claim 1, wherein the interlayer connecting conductor is provided in an intermediate portion of the opposing region.

3. The multilayer board according to claim 1, wherein at least one of the pair of through-holes is defined by slits in which the length dimension intersects the lateral direction in the plan view.

4. The multilayer board according to claim 1, wherein
   at least one of the pair of through-holes is divided into a plurality of holes, and located at intervals in a direction intersecting the lateral direction in the plan view; and
   the length dimension of the plurality of holes corresponds to a dimension across all of the plurality of holes in the direction intersecting the lateral direction in the plan view.

5. The multilayer board according to claim 1, wherein
   the flexible substrate is further provided with another pair of through-holes different from the pair of through-holes that penetrates the plurality of the insulating layers; and
   the another pair of through-holes oppose each other with the interlayer connecting conductor provided between the another pair of through-holes in the lateral direction in the plan view.

6. The multilayer board according to claim 1, wherein
   the flexible substrate is further provided with another pair of through-holes different from the pair of through-holes that penetrates the plurality of the insulating layers; and
   the another pair of through-holes oppose each other with the interlayer connecting conductor provided between the another pair of through-holes in a direction intersecting the lateral direction in the plan view.

7. The multilayer board according to claim 1, wherein the interlayer connecting conductor includes a through-hole via that penetrates the plurality of the insulating layers.

8. The multilayer board according to claim 1, wherein the interlayer connecting conductor includes a hollow via.

9. The multilayer board according to claim 1, wherein
   the interlayer connecting conductor includes:
      a plurality of via conductors that penetrate the different insulating layers, respectively, and that are offset in a width direction orthogonal or substantially orthogonal to the lateral direction in the plan view; and a connecting conductor that connects the plurality of via conductors.

10. The multilayer board according to claim 1, wherein an elastic body having an elastic modulus lower than an elastic modulus of the insulating layer is provided in at least one of the pair of through-holes.

11. The multilayer board according to claim 1, wherein a thickness of each of the plurality of insulating layers is between about 30 μm and about 80 μm.

12. The multilayer board according to claim 1, wherein the interlayer connecting conductor electrically connects an upper surface conductor provided on an upper surface of one of the plurality of insulating layers to a lower surface conductor provided on a lower surface of the one of the plurality of insulating layers.

13. The multilayer board according to claim 1, wherein the plurality of insulating layers include a thermoplastic resin.

14. The multilayer board according to claim 1, further comprising a second interlayer connecting conductor provided in the opposing region.

15. The multilayer board according to claim 1, wherein
the interlayer connecting conductor is sandwiched between side surfaces of the pair of through-holes; and
an extending direction of the side surfaces of the pair of through-holes is different from the direction of curvature of the flexible substrate.

16. The multilayer board according to claim 2, wherein a distance from a center of the interlayer connecting conductor to a center of a first through-hole of the pair of through-holes is equal or substantially equal to a distance from the center of the interlayer connecting conductor to center of a second through-hole of the pair of through-holes.

17. The multilayer board according to claim 3, wherein at least one of the pair of through-holes is defined by slits in which the length dimension extends in a direction orthogonal or substantially orthogonal to the lateral direction in the plan view.

18. The multilayer board according to claim 3, wherein each of the slits has a rectangular or substantially rectangular shape.

19. The multilayer board according to claim 12, wherein, in the lateral direction, a length of contact between the interlayer connecting conductor and each of the upper and lower surface conductors is less than a length of at least one of the pair of through holes.

20. A connecting structure of a multilayer board, the multilayer board comprising:
a flexible substrate that includes a plurality of insulating layers stacked and a pair of through-holes penetrating the plurality of insulating layers; and
an interlayer connecting conductor provided in an opposing region in which the pair of through-holes opposes each other in a plan view of the plurality of insulating layers viewed from a stacking direction; wherein
the flexible substrate is attached to an object to be connected and a cross section of the flexible substrate taken in a lateral direction passing through the pair of through-holes and the interlayer connecting conductor and the stacking direction is curved in a U shape or an S shape;
in the cross section, a curvature radius of an inner region located between the pair of through-holes is larger than a curvature radius of an outer region adjacent to the pair of through-holes on an outer side thereof;
in the cross section, a length dimension of each of the pair of through holes is different from a direction of curvature of the flexible substrate; and
in the plan view of the plurality of insulating layers, the length dimension is a longest dimension of each of the pair of through holes.

21. The multilayer board according to claim 20, wherein
the interlayer connecting conductor is sandwiched between side surfaces of the pair of through-holes; and
an extending direction of the side surfaces of the pair of through-holes is different from the direction of curvature of the flexible substrate.

* * * * *